United States Patent [19]

Jaffe et al.

[11] Patent Number: 5,476,520
[45] Date of Patent: Dec. 19, 1995

[54] SHIELD ASSEMBLY FOR SEMICONDUCTOR WAFER SUPPORTS

[75] Inventors: Peter R. Jaffe, Hove; Kevin Fairbairn, Partridge Green, both of England

[73] Assignee: Applied Materials, Inc., Santa Clara, Calif.

[21] Appl. No.: 799,748

[22] Filed: Nov. 22, 1991

Related U.S. Application Data

[60] Continuation of Ser. No. 505,740, Apr. 6, 1990, abandoned, which is a division of Ser. No. 377,692, Jul. 10, 1989, Pat. No. 4,937,206.

[51] Int. Cl.$^6$ .............................. C23C 14/48; C23C 14/50
[52] U.S. Cl. ...................... 29/25.01; 204/192.1; 118/730; 118/45; 216/62
[58] Field of Search .................................. 357/40, 84, 91; 204/192.1, 192.35; 250/492.2, 398; 156/646, 643; 118/730; 29/25.01

[56] References Cited

U.S. PATENT DOCUMENTS

| | | | |
|---|---|---|---|
| 3,889,632 | 7/1975 | Brunner et al. | 118/53 |
| 4,397,724 | 8/1983 | Moran | 204/192.35 |
| 4,718,975 | 1/1988 | Bowling et al. | 204/192.1 |
| 4,733,091 | 3/1988 | Robinson et al. | 118/730 |

FOREIGN PATENT DOCUMENTS

| | | |
|---|---|---|
| 50-36147 | 9/1983 | Japan. |
| 61-13542 | 6/1984 | Japan ........................... H01J 37/317 |
| 59-61043 | 7/1984 | Japan. |
| 59-201419 | 11/1984 | Japan. |
| 62-54039 | 9/1985 | Japan. |
| 60-120515 | 11/1985 | Japan. |
| 59-6544 | 7/1992 | Japan. |

OTHER PUBLICATIONS

IBM Technical Disclosure Bulletin, vol. 27, No. 10A Mar., 1935.

Primary Examiner—Rolf Hille
Assistant Examiner—Wael M. Fahmy
Attorney, Agent, or Firm—Birgit E. Morris

[57] ABSTRACT

A method for preventing cross-contamination of semiconductor wafers during processing comprising covering a surface portion of a support assembly with a process compatible material, engaging a semiconductor wafer with the support assembly, processing the wafer while it is engaged with the support member, and removing the process compatible material from the support assembly after said material is considered to be contaminated. A shield particularly adapted for this process includes a shield portion made from a process compatible material and a process-compatible adhesive for attaching the shield portion to the support assembly.

8 Claims, 2 Drawing Sheets

SHIELD ASSEMBLY FOR SEMICONDUCTOR WAFER SUPPORTS

This is a continuation of U.S. application Ser. No. 07/505,740, now abandoned filed Apr. 6, 1990 which is a divisional of U.S. application Ser. No. 07/377,692 filed Jul. 10, 1989, now U.S. Pat. No. 4,937,206.

BACKGROUND OF THE INVENTION

1. Field of the Invention

This invention relates generally to semiconductor processing equipment and more particularly to ion implantation end stations.

2. Description of the Related Art

Ion implanters are used to implant various types of ions into semiconductor wafers to change the electrical characteristics of the wafers. For example, boron, phosphorous, arsenic, and oxygen are all typically implanted to create p-type, n-type, or insulating regions within the semiconductor wafer.

In an ion implantation machine, an ion beam is generated and is scanned across the surfaces of the wafers. During this process, the beam also impinges upon surrounding surfaces, such as the wafer support wheel, causing ion implantation into these surfaces.

The problem of cross-contamination arises when ions of different types are implanted using the same ion implanter apparatus. For example, if wafers are first subjected to a phosphorous implant a certain percentage of the phosphorous ions will be implanted into the surrounding surfaces. If another set of wafers are then subjected to an arsenic implant some of the phosphorous ions which were implanted into the surrounding surfaces will be released, contaminating this new set of wafers with phosphorous.

This problem has been addressed in the prior art in several ways. One obvious, but expensive, solution is to have a dedicated ion implanter for each species of ions to be implanted thereby eliminating any chance of cross-contamination. However, with ion implanters costing in the range of $500,000–$2,000,000 this is not a particularly desirable solution.

Another solution to the cross-contamination problem is to remove the contaminated surfaces by either thoroughly cleaning them with an abrasive substance, or by re-machining them. However, this is an expensive process which results in considerable machine downtime. Furthermore, the cleaning or re-machining process can introduce undesirable particulates into the ion implantation machine.

A partial solution to the cross-contamination problem is to minimize the surrounding surface area into which ions can be implanted. This approach is taken with the Precision 9000 and Precision 9200 ion implanters produced by the Applied Implant Technology Division (Horsham, England) of Applied Materials, Inc. (Santa Clara, Calif.). In the Precision 9000 and 9200 systems, wafers are supported on a spoked wheel thereby presenting minimal surface areas for potentially cross-contaminating implantation into surrounding surfaces. However, even the Precision 9000 and 9200 systems present the potential for cross-contamination due to implantation into the spokes of the wafer support wheel.

SUMMARY OF THE INVENTION

An object of this invention is to provide a method and apparatus for minimizing cross-contamination during ion implantation of semiconductor wafers.

Briefly, one embodiment of the present invention includes a shield member which covers exposed areas of the wafer support wheel near the support wafers. The shield members are made from a process compatible material capable of blocking and absorbing the ion beam, and are held in position with a vacuum compatible adhesive. Alternatively, the exposed areas of the wafer support wheel can be coated with a process compatible coating which is later stripped from the wheel to remove the contaminating materials. After the material is contaminated it is removed and replaced with fresh ion absorbing material.

An advantage of the present invention is that cross-contamination of species can be virtually eliminated in a simple and cost-effective manner. The need for dedicated ion implantation systems is eliminated.

These and other object and advantages of the present invention will no doubt become apparent upon a reading of the following descriptions and a study of the various figures of the drawing.

DETAILED DESCRIPTION OF THE PREFERRED EMBODIMENTS

Figure 1:
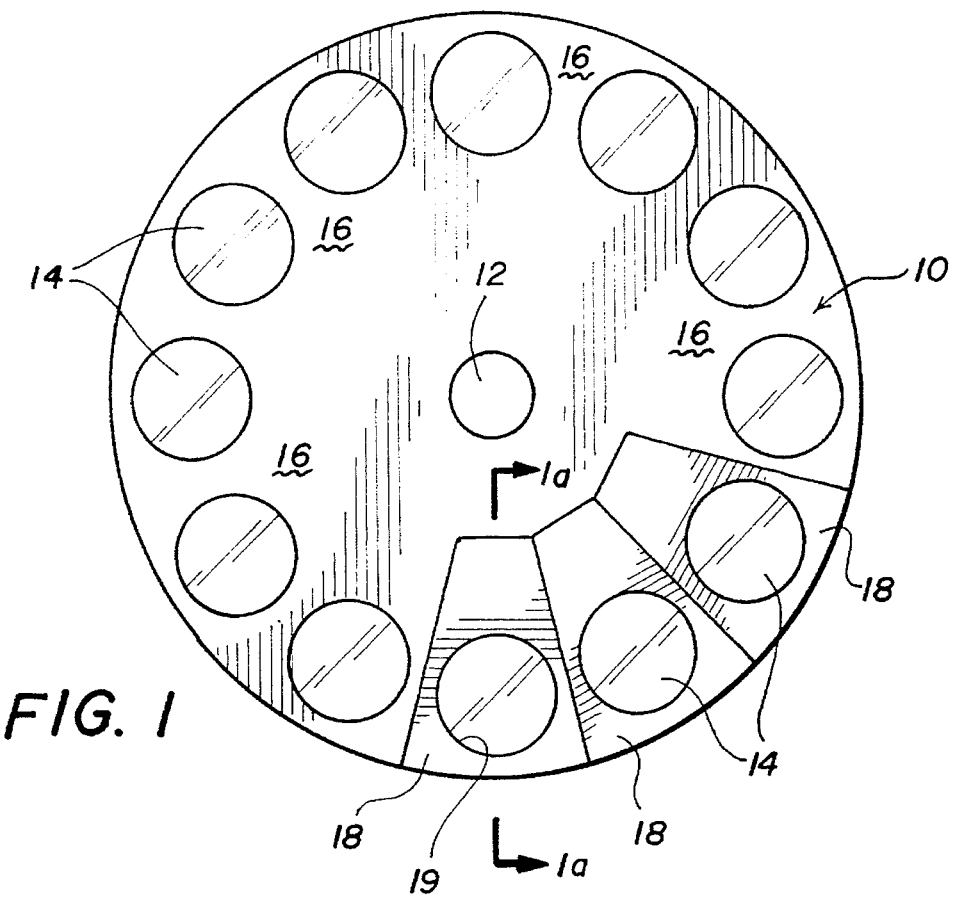
FIG. 1 is a front elevational view of a solid ion implantation wheel provided with shield members in accordance with the present invention.

In FIG. 1 a solid wafer support wheel 10 is supported by a hub 12 for rotation. The wheel 10 holds a number of semiconductor wafers 14 proximate to its circumference. As the wafers 14 are scanned past an ion beam, ions are implanted both into the wafers 14 and into surrounding regions 16 of the wheel 10, creating a potential source of cross-contamination. In accordance with the present invention, shields 18 are attached to the surface of the wheel 10 to cover these surrounding regions 16. The shields 18 are generally wedge-shaped, and have an aperture 19 through which the wafers 14 are implanted. Three of these shields 18 are shown in FIG. 1; obviously an additional nine shields would be used to completely cover the exposed surrounding regions 16.

Figure 1A:
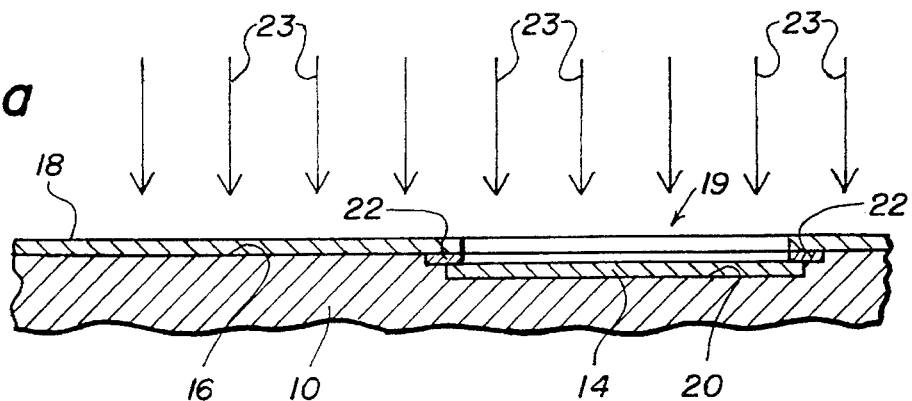
FIG. 1a is a partial cross-sectional view taken along line 1a–1a of FIG. 1.

In the cross-sectional view of FIG. 1a, the wafer 14 is held within a circular recess 20 of support wheel 10. A clamping ring 22 can be used to hold the wafer 14 in position. The shield 18 covers both the surrounding regions 16 and the clamping ting 22 to minimize the surface area of the support wheel into which ions can be implanted. Aperture 19 of the shield is aligned with the surface area of wafer 14 to permit implantation of ions 23 into the surface of wafer 14.

Figure 2:
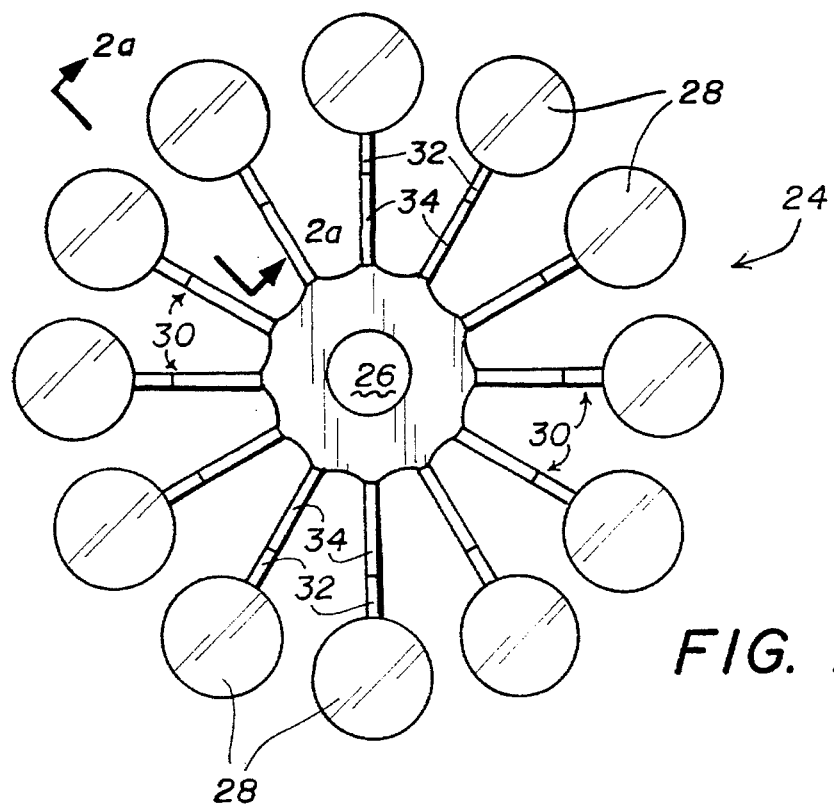
FIG. 2 is a front elevational view of a spoked ion implantation wheel provided with shield members in accordance with the present invention.

FIG. 2 illustrates a spoked wafer support wheel 24 of the aforementioned type made by Applied Materials, Inc. The wheel 24 rotates around a hub 26 and supports a number of semiconductor wafers 28 at the end of spokes 30. As is apparent from this figure, the surrounding regions into which ions may be implanted is much reduced with this design as opposed to the solid support wheel illustrated in FIG. 1. However, ions can still be implanted into spokes 30 of support wheel 24, thereby presenting a potential source of cross-contamination. To eliminate this possibility, the spokes 30 are provided with shields 32 and 34 to cover the areas of spokes 30 which might be exposed to the ion beam.

Figure 2A:
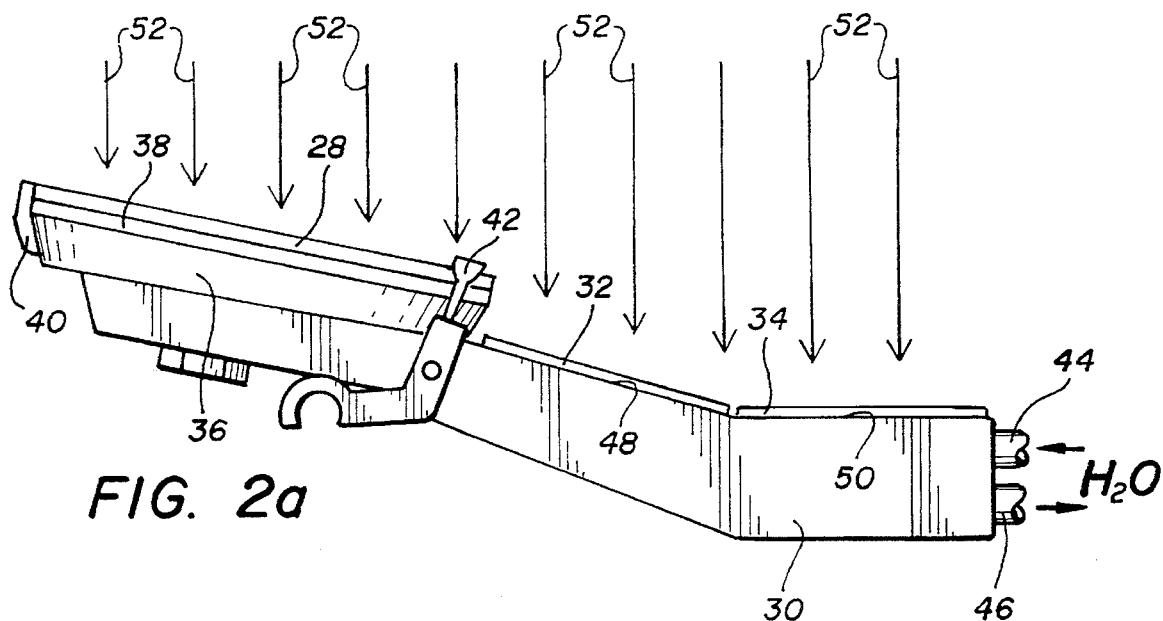
FIG. 2a is a partial side view taken along line 2a–2a of FIG. 2.

In FIG. 2a, a platen 36 supports a wafer 28 on a thermally conductive elastomeric pad 38. Fixed restraints 40 and retractable restraints 42 firmly hold the wafer 28 on the pad 38. The spoke 30 has an inlet 44 and an outlet 46 for cooling water which circulates through platen 36. Shields 32 and 34 cover the surfaces 48 and 50, respectively, of spoke 30 which would otherwise be subjected to ion implantation from ion beam 52. Alternatively, a single suitably conformal shield (not shown) can be applied to surfaces 48 and 50 of spoke 30.

The shields as thus far described can be shields attached to the surrounding regions of the support wheel by means of a process compatible adhesive, or they can be shields formed by coating the surrounding regions with a suitable liquid coating which is subsequently cured to form a solid coating. For example, certain organic materials such as liquid photoresists may be applied to the surrounding regions and allowed to dry to form a process compatible shield. After the process is completed, the photoresist can be removed mechanically or by means of a suitable solvent to remove potentially contaminating materials. However, due to the relative difficulty of applying and removing coatings to the support wheel, the best mode currently contemplated for the present invention is to attach shield members to the support wheel by means of a suitable adhesive.

Figure 3:
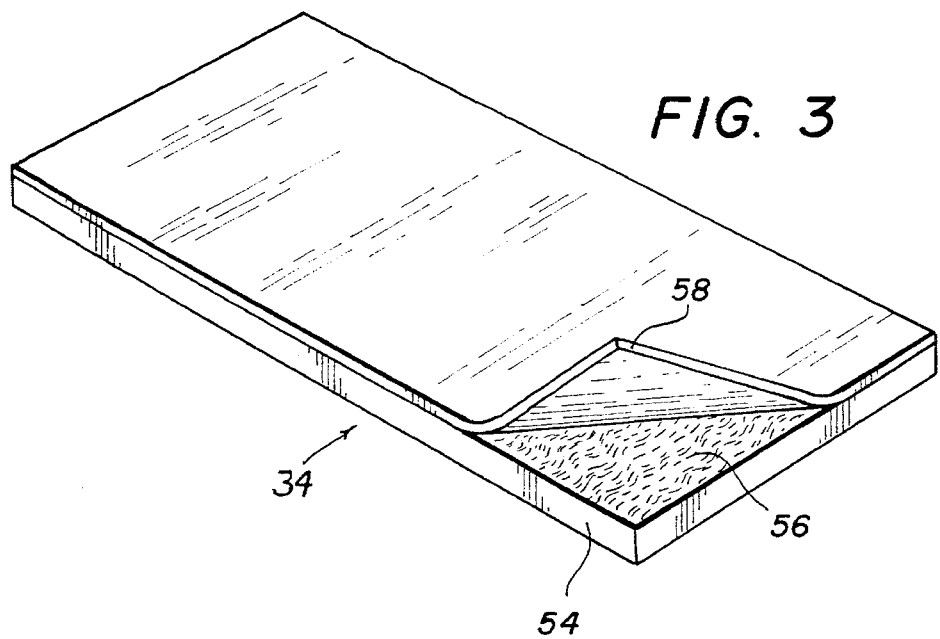
FIG. 3 is a perspective view of a shield member in accordance with the present invention.

In FIG. 3, a shield 34 includes a shield portion 54 and adhesive portion 56. A removable strip 58 protects the adhesive portion 56 prior to its attachment to a wafer support wheel. The shield portion 54 is made from a process compatible material which will not contaminate or otherwise interfere with the processing of the semiconductor wafers. Since heavy metals might cause process yield problems, the material of shield portion 54 preferably has an atomic weight of no greater than fourteen. Suitable elemental materials for shield portion 54 include aluminum, silicon, and carbon. Alternatively, various metal alloys or organic materials such as polycarbonates can be used as the material of shield portion 54. Besides being non-contaminating, the shield portion 54 should be able to block and absorb the majority of ions impinging upon it without substantial outgassing, which could impair the vacuum environment.

The adhesive portion 56 should be made from a vacuum compatible peelable adhesive such as 280A™ made by Dow Corning. Most peelable adhesives are prone to outgassing when in a vacuum and are therefore unsuitable for use in the present invention due to contamination problems. The aforementioned 280A adhesive is also strong enough to hold the shield portions in place against the centrifugal forces created by the spinning support wheels.

In summary, as should be apparent from the above discussions, a method for preventing cross-contamination of species during ion implantation in accordance with the present invention involves the steps of: 1) covering a surface portion of the support wheel with a shield; 2) engaging a semiconductor wafer with the support wheel; 3) processing the wafer while it is engaged with the support wheel; and 4) removing the shield from the support wheel after it is considered to be contaminated. In some cases, the shield may be considered to be contaminated after one processing cycle, but in the majority of cases the shield may be used for multiple processing cycles, i.e. until it becomes sufficiently contaminated to affect the yield of the system. In this manner, cross-contamination of species is minimized.

While the present invention has been described in terms of several preferred embodiments various alterations, modifications, and extensions thereof will no doubt become apparent to those skilled in the art upon a study of the specification and drawings. For example, while the present invention was discussed in the context of ion implantation systems it is also applicable to other type of semiconductor processing equipment such as plasma etchers, chemical vapor deposition apparatus, physical vapor deposition apparatus, etc. It is therefore intended that the following appended claims be interpreted as including all such alterations, modifications, and extensions which are within the true spirit and scope of the present invention.

What is claimed is:

1. An implantation shield for an ion implantation machine comprising:

a shielding member made from a process compatible material; and a vacuum compatible adhesive for attaching said shielding member to a surface of an ion implantation machine wafer support which is to be shielded during an ion implantation process, said adhesive able to be stripped from said support when the shield becomes contaminated.

2. An implantation shield as recited in claim 1 wherein said process compatible material does not have substantial quantities of any components having an atomic weight greater than fourteen.

3. An implantation shield as recited in claim 2 wherein said process compatible material comprises at least one of the following elements: aluminum, silicon, and carbon.

4. An implantation shield as recited in claim 1 wherein said process compatible material comprises an organic material.

5. An implantation shield as recited in claim 1 wherein said shielding member is provided with an aperture through which a wafer supported by said wafer support may be implanted with ions.

6. An implantation shield as recited in claim 1 wherein said adhesive is applied to a surface of said shielding member.

7. An implantation shield as recited in claim 6 further comprising a removable strip covering said adhesive.

8. An implantation shield as recited in claim 1 wherein said adhesive includes 280A adhesive from Dow Corning or the equivalent.

* * * * *